United States Patent
Tipirneni et al.

(10) Patent No.: US 9,396,948 B2
(45) Date of Patent: Jul. 19, 2016

(54) LAYER TRANSFER OF SILICON ONTO III-NITRIDE MATERIAL FOR HETEROGENOUS INTEGRATION

(71) Applicant: Texas Instruments Incorporated, Dallas, TX (US)

(72) Inventors: Naveen Tipirneni, Plano, TX (US); Sameer Pendharkar, Allen, TX (US); Rick L. Wise, Fairview, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/886,652

(22) Filed: May 3, 2013

(65) Prior Publication Data
US 2014/0329370 A1    Nov. 6, 2014

(51) Int. Cl.
*H01L 21/34* (2006.01)
*H01L 21/18* (2006.01)
*H01L 21/762* (2006.01)
*H01L 21/8258* (2006.01)

(52) U.S. Cl.
CPC ........ *H01L 21/187* (2013.01); *H01L 21/76254* (2013.01); *H01L 21/8258* (2013.01)

(58) Field of Classification Search
CPC .............. H01L 21/76251; H01L 21/76254; H01L 21/76259; H01L 21/2007; H01L 21/187; H01L 29/26; H01L 29/267
See application file for complete search history.

(56) References Cited

U.S. PATENT DOCUMENTS

| | | | | |
|---|---|---|---|---|
| 7,732,865 B2* | 6/2010 | Furukawa et al. | ............ | 257/347 |
| 7,994,550 B2* | 8/2011 | Kaper | ................ | H01L 21/8258 257/289 |
| 8,067,293 B2* | 11/2011 | Park | ............................. | 438/443 |
| 8,120,060 B2* | 2/2012 | Fitzgerald | ..................... | 257/184 |
| 8,212,294 B2* | 7/2012 | Hoke | ................ | H01L 21/76251 257/255 |
| 2003/0183876 A1* | 10/2003 | Takafuji | ............ | H01L 21/76254 257/347 |
| 2013/0234145 A1* | 9/2013 | Hirler | ................. | H01L 21/8258 257/76 |

OTHER PUBLICATIONS

Lee, Hung-Seok et al., 'Wafer-level heterogeneous integration of GaN HEMTs and Si (100) MOSFETs,' Feb. 2012, IEEE Electron Device Letters, vol. 33, No. 2, pp. 200-202.*
Liang, Di et al., 'Hybrid integrated platforms for silicon photonics,' Mar. 2010, Materials vol. 3 pp. 1782-1802.*

(Continued)

*Primary Examiner* — Bryan Junge
(74) *Attorney, Agent, or Firm* — Jacqueline J. Garner; Frank D. Cimino

(57) ABSTRACT

An integrated silicon and III-N semiconductor device may be formed by growing III-N semiconductor material on a first silicon substrate having a first orientation. A second silicon substrate with a second, different, orientation has a release layer between a silicon device film and a carrier wafer. The silicon device film is attached to the III-N semiconductor material while the silicon device film is connected to the carrier wafer through the release layer. The carrier wafer is subsequently removed from the silicon device film. A first plurality of components is formed in and/or on the silicon device film. A second plurality of components is formed in and/or on III-N semiconductor material in the exposed region. In an alternate process, a dielectric interlayer may be disposed between the silicon device film and the III-N semiconductor material in the integrated silicon and III-N semiconductor device.

13 Claims, 16 Drawing Sheets

(56) References Cited

OTHER PUBLICATIONS

Duo et al., Evolution of hydrogen and helium co-implanted single-crystal silicon during annealing, Journal of Applied Physics vol. 90, No. 8, Oct. 15, 2001.

Ji et al., Laser lift-off transfer of AlGaN/GaN HEMTs from sapphire onto Si: A thermal perspective, Solid-State Electronics 53 (2009) 526-529.

Chung et al., N-Face GaN/AlGaN HEMTs Fabricated Through Layer Transfer Technology, IEEE Electron Device Letters, vol. 30, No. 2, Feb. 2009.

Chung et al., Seamless On-Wafer Integration of Si(100) MOSFETs and GaN HEMTs, IEEE Electron Device Letters, vol. 30, No. 10, Oct. 2009.

Tong et al., A "smarter-cut" approach to low temperature silicon layer transfer, Appl. Phys. Lett. 72 (1), Jan. 5, 1998.

* cited by examiner

US 9,396,948 B2

LAYER TRANSFER OF SILICON ONTO III-NITRIDE MATERIAL FOR HETEROGENOUS INTEGRATION

FIELD OF THE INVENTION

This invention relates to the field of semiconductor devices. More particularly, this invention relates to integrated silicon and III-N semiconductor devices.

BACKGROUND OF THE INVENTION

An integrated silicon and III-N semiconductor device may have electronic components such as metal oxide semiconductor (MOS) transistors formed in silicon, and other electronic components such as gallium nitride field effect transistors (GaN FETs) or optoelectronic components such as photodetectors, light emitting diodes (LEDs) or lasers formed in III-N semiconductor material, with the silicon and III-N semiconductor material disposed on a common substrate. It may be desirable to integrate the silicon and III-N semiconductor material on a common substrate prior to fabricating the components in the silicon and in the III-N semiconductor material.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated silicon and III-N semiconductor device may be formed by growing III-N semiconductor material on a first silicon substrate having a first orientation. A second silicon substrate with a second, different, orientation is ion implanted with a separating species to form a release layer between a silicon device film at a top surface of the second silicon substrate and a carrier wafer at a bottom of the second silicon substrate. The silicon device film is attached to the III-N semiconductor material while the silicon device film is connected to the carrier wafer through the release layer. The carrier wafer is subsequently removed from the silicon device film. The silicon device film is then bonded to the III-N semiconductor material. A first plurality of components is formed in and/or on the silicon device film. A portion of the silicon device film is removed to expose the III-N semiconductor material. A second plurality of components is formed in and/or on III-N semiconductor material in the exposed region.

In an alternate process, a dielectric interlayer may be formed on the silicon device film and/or the III-N semiconductor material prior to the attaching step, so that the dielectric interlayer is disposed between the silicon device film and the III-N semiconductor material in the integrated silicon and III-N semiconductor device.

DETAILED DESCRIPTION OF EXAMPLE EMBODIMENTS

Figure 1A:
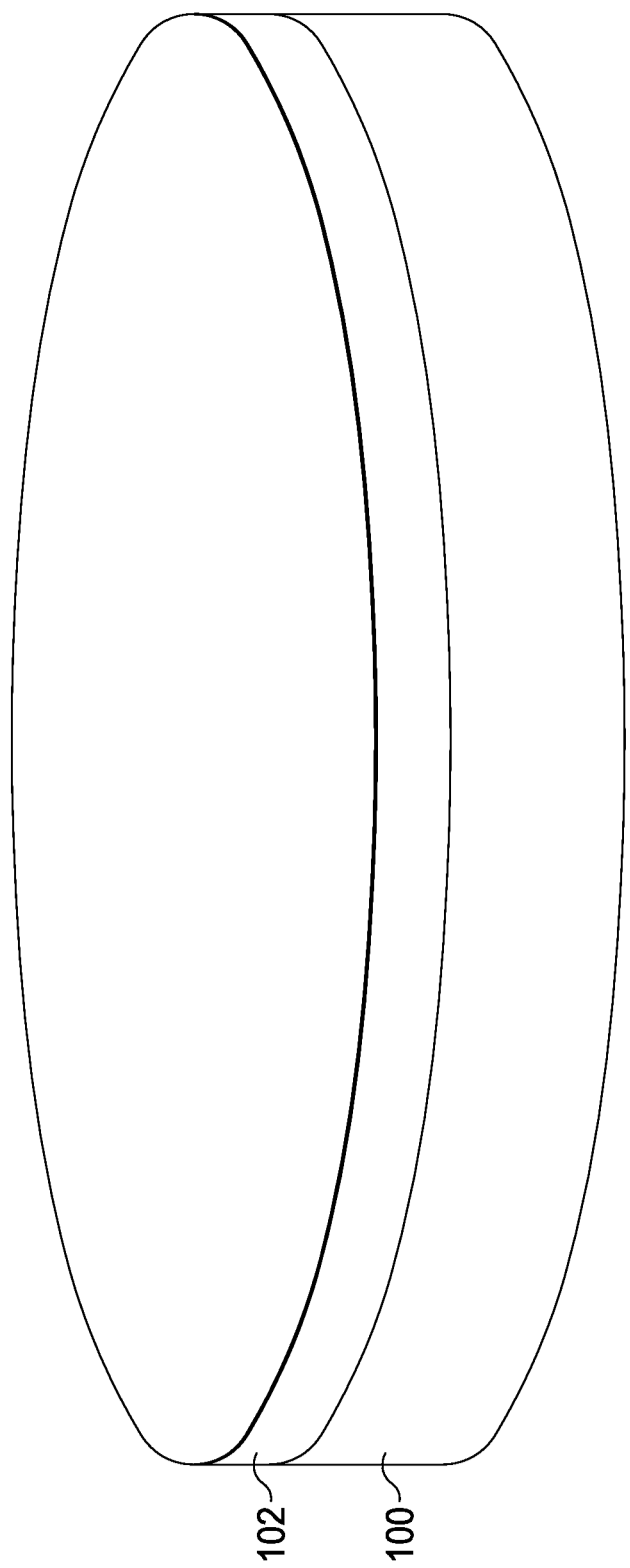
FIG. 1A through FIG. 1H depict formation of an integrated silicon and III-N semiconductor device in successive stages of fabrication.

The following co-pending patent applications are related and hereby incorporated by reference:

U.S. patent application Ser. No. 13/886,378 (TI-71206 filed simultaneously with this application, entitled "AVALANCHE ENERGY HANDLING CAPABLE III-NITRIDE TRANSISTORS;"

U.S. patent application Ser. No. 13/886,410 (TI-71208 filed simultaneously with this application, entitled "III-NITRIDE ENHANCEMENT MODE TRANSISTORS WITH TUNABLE AND HIGH GATE-SOURCE VOLTAGE RATING;"

U.S. patent application Ser. No. 13/886,429 (TI-71209 filed simultaneously with this application, entitled "III-NITRIDE TRANSISTOR LAYOUT;"

U.S. patent application Ser. No. 13/886,688 (TI-72417 filed simultaneously with this application, entitled "RESURF III-NITRIDE HEMTS;"

U.S. patent application Ser. No. 13/886,709 (TI-72418 filed simultaneously with this application, entitled "METHOD TO FORM STEPPED DIELECTRIC FOR FIELD PLATE FORMATION;" and U.S. patent application Ser. No. 13/886,744 (TI-72605 filed simultaneously with this application, entitled "GaN DIELECTRIC RELIABILITY ENHANCEMENT."

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated silicon and III-N semiconductor device may be formed by growing III-N semiconductor material on a first silicon substrate having a first orientation. A second silicon substrate with a second, different, orientation is ion implanted with a separating species to form a release layer between a silicon device film at a top surface of the second silicon substrate and a carrier wafer at a bottom of the second silicon substrate. The silicon device film is attached to the III-N semiconductor material while the silicon device film is connected to the carrier wafer through the release layer. The carrier wafer is subsequently removed from the silicon device film. The silicon device film is then bonded to the III-N semiconductor material. A first plurality of components is formed in and/or on the silicon device film. A portion of the silicon device film is removed to expose the III-N semiconductor material. A second plurality of components is formed in III-N semiconductor material in and/or on the exposed region.

In an alternate process, a dielectric interlayer may be formed on the silicon device film and/or the III-N semiconductor material prior to the attaching step, so that the dielectric interlayer is disposed between the silicon device film and the III-N semiconductor material in the integrated silicon and III-N semiconductor device.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide the remainder of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. III-N materials may be written with variable subscripts to denote a range of possible stoichiometries. For example, aluminum gallium nitride may be written as $Al_xGa_{1-x}N$ and indium aluminum gallium nitride may be written as $In_xAl_yGa_{1-x-y}N$. For the purposes of this description, the term GaN FET is understood to refer to a field effect transistor which includes III-N semiconductor materials.

FIG. 1A through FIG. 1H depict formation of an integrated silicon and III-N semiconductor device in successive stages of fabrication. Referring to FIG. 1A, a silicon single-crystal first substrate 100 is provided with a first crystal orientation, for example a 111 orientation. A layer stack of III-N semiconductor material 102 is formed on a top surface of the first substrate 100. The first crystal orientation may be selected to facilitate growth of the layer stack of III-N semiconductor material 102. The layer stack of III-N semiconductor material 102 may include, for example, a mismatch isolation layer of 100 to 300 nanometers of aluminum nitride formed on the top surface of the first substrate 100, and a buffer layer of 1 to 7 microns of graded layers of $Al_xGa_{1-x}N$, which is aluminum rich at the mismatch isolation layer and is gallium rich at a top surface of the buffer layer. In some versions of the instant example, the layer stack of III-N semiconductor material 102 may also include an electrical isolation layer of 300 to 2000 nanometers of semi-insulating gallium nitride formed on the buffer layer, and a low-defect layer of 25 to 1000 nanometers of gallium nitride formed on the electrical isolation layer.

In further versions of the instant example, the layer stack of III-N semiconductor material 102 may also include a barrier layer formed on the low-defect layer. The barrier layer may be, for example, 8 to 30 nanometers of $Al_xGa_{1-x}N$ or $In_xAl_yGa_{1-x-y}N$. A composition of group III elements in the barrier layer may be, for example, 24 to 28 percent aluminum nitride and 72 to 76 percent gallium nitride. Forming the barrier layer on the low-defect layer generates a two-dimensional electron gas in the low-defect layer just below the barrier layer with an electron density of, for example, $1\times10^{12}$ to $2\times10^{13}$ cm$^{-2}$. The layer stack of III-N semiconductor material 102 may also include an optional cap layer of 2 to 5 nanometers of gallium nitride may be formed on the barrier layer.

Figure 1B:
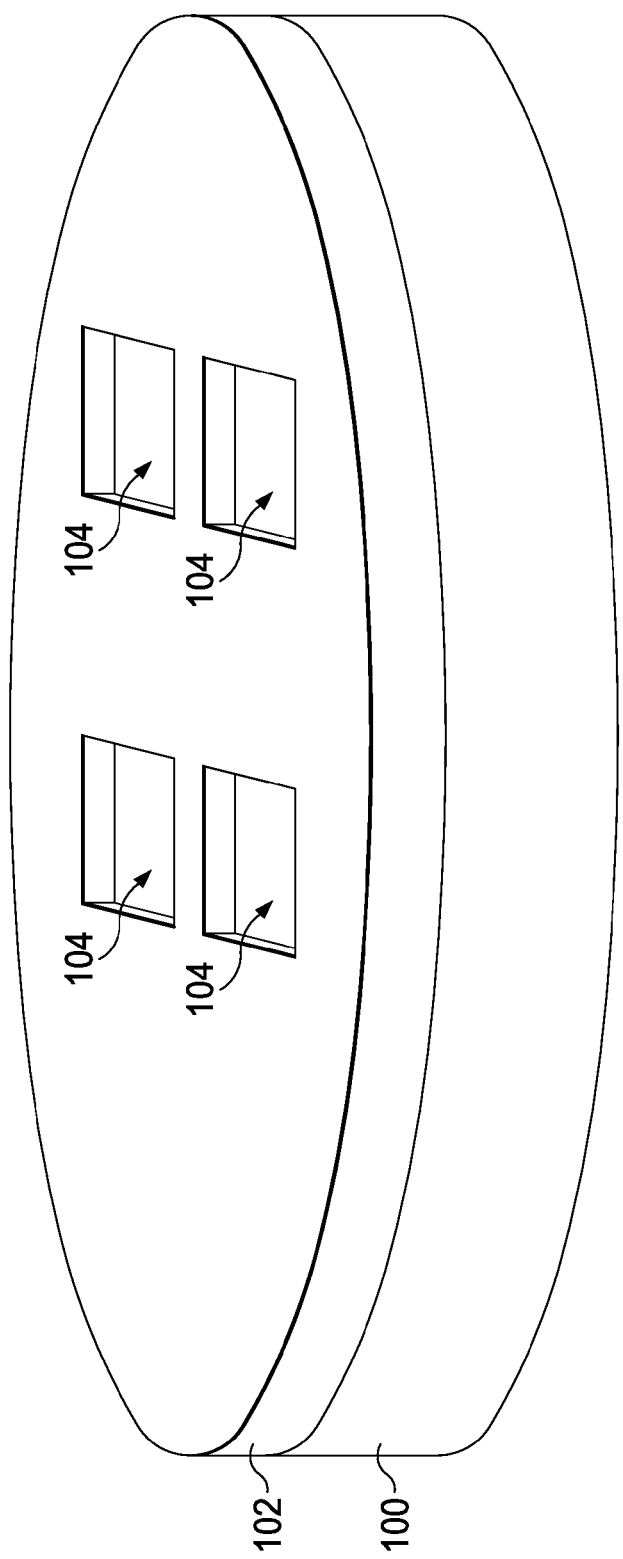

Referring to FIG. 1B, in versions of the instant example in which a two-dimensional electron gas is formed in the layer stack of III-N semiconductor material 102, isolation regions 104 are formed in areas defined for a subsequent silicon film. Formation of the isolation regions 104 may include removal of material from the layer stack of III-N semiconductor material 102 so that the two-dimensional electron gas is disrupted in the isolation regions 104, as depicted in FIG. 1B. Alternatively, formation of the isolation regions 104 may include ion implanting dopants so that the two-dimensional electron gas is disrupted in the isolation regions 104.

Figure 1C:
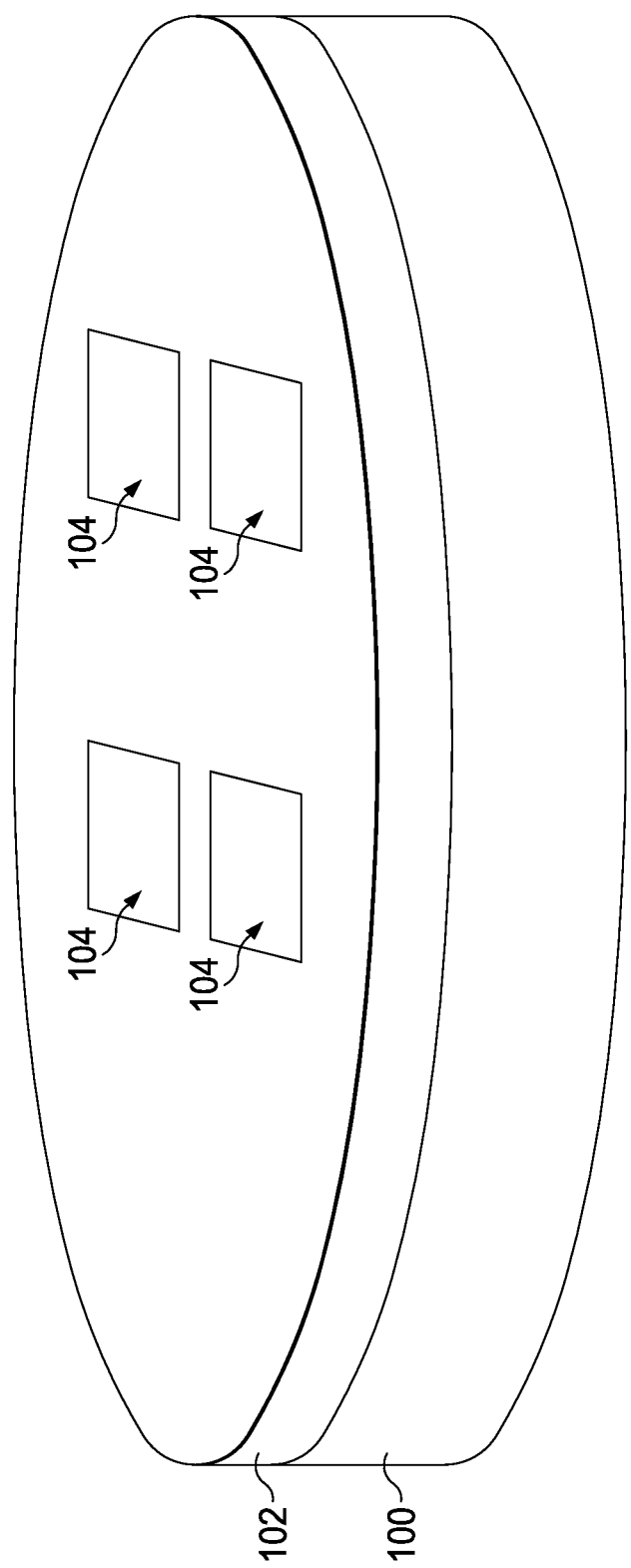

Referring to FIG. 1C, in versions of the instant example in which material is removed from the layer stack of III-N semiconductor material 102 in the isolation regions 104, dielectric material is formed in the isolation regions 104 and subsequently planarized to be substantially coplanar with a top surface of the layer stack of III-N semiconductor material 102, as depicted in FIG. 1C. The dielectric material may be, for example, silicon dioxide formed by a plasma enhanced chemical vapor deposition (PECVD) process using tetraethyl orthosilicate, also known as tetraethoxysilane or TEOS.

Figure 1D:
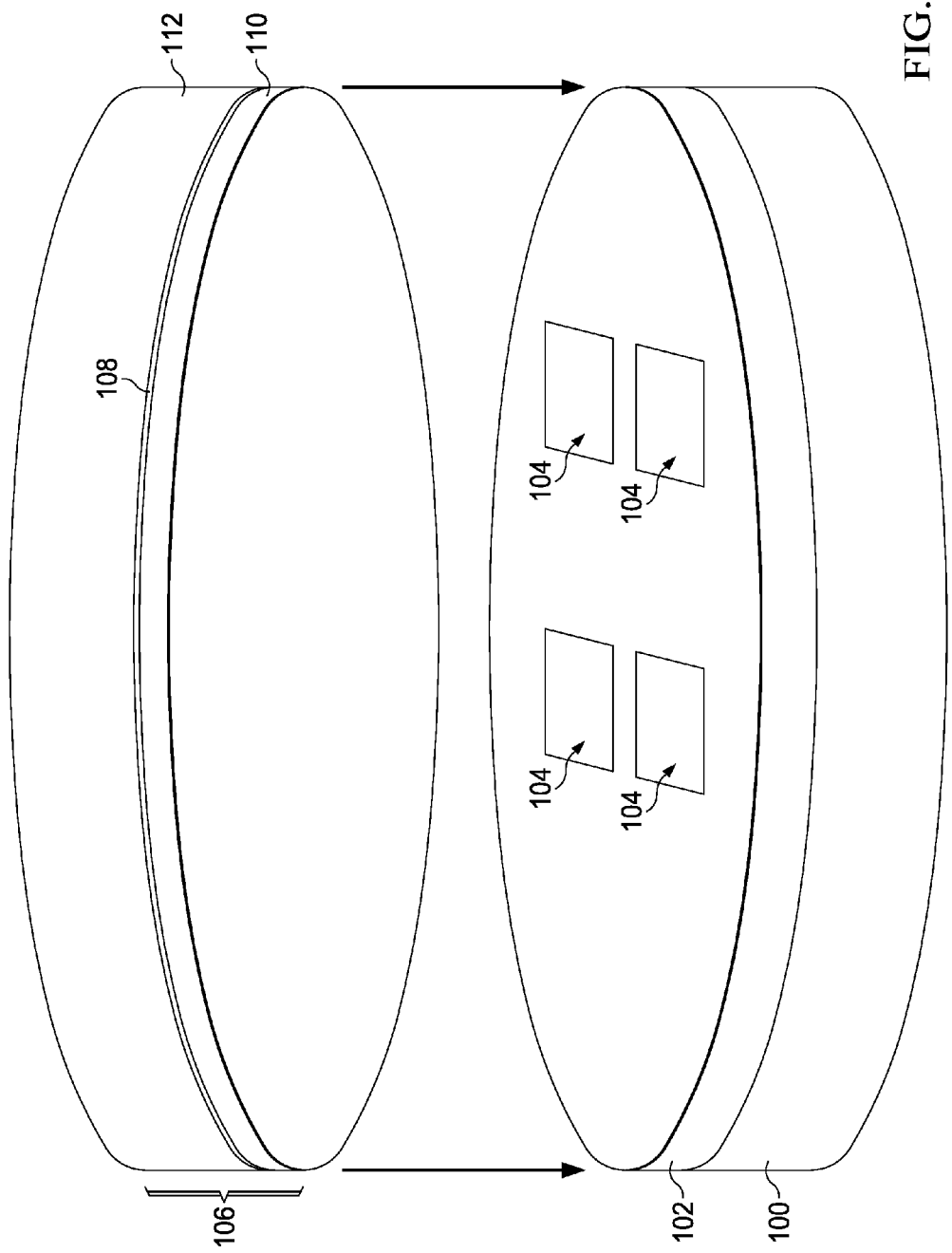

Referring to FIG. 1D, a second silicon substrate 106 is provided with a second crystal orientation which is different than the first orientation of the first substrate 100. For example, the second crystal orientation may be 100. A cleaving species, such as hydrogen, is ion implanted into the second silicon substrate 106 at a sufficient dose and energy to form a separation layer 108 which is disposed between a silicon device film 110 and a carrier portion 112 of the second silicon substrate 106. The second crystal orientation may be selected to enhance performance of subsequently formed components in the silicon device film 110. The silicon device film 110 may be, for example, 2 to 5 microns thick. The cleaving species may be hydrogen, implanted at a dose of $5\times10^{16}$ cm$^{-2}$ to $2\times10^{17}$ cm$^{-2}$ at an energy of 225 keV for a 2 micron thickness of the silicon device film 110 to 450 keV for a 5 micron thickness. After the separation layer 108 is formed, the silicon device film 110 may be cleaned in an aqueous mixture of hydrogen peroxide and ammonium hydroxide.

Figure 1E:
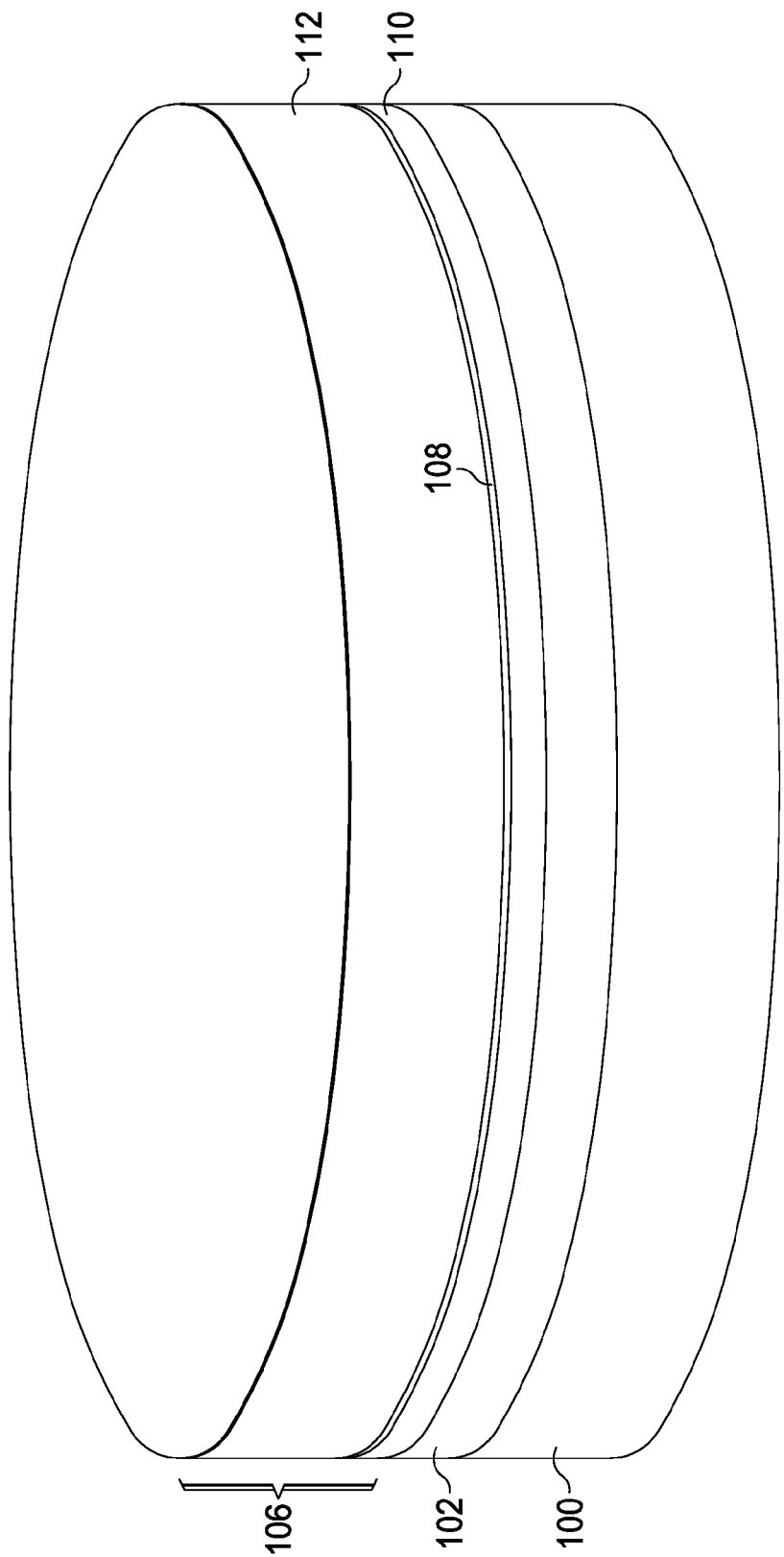

Referring to FIG. 1E, a bonding operation is performed in which the silicon device film 110 is at least partially attached to the layer stack of III-N semiconductor material 102. The bonding operation may include, for example, pressing the silicon device film 110 and the layer stack of III-N semiconductor material 102 together at 0.8 megapascals to 1 megapascal pressure and 400° C. to 420° C. The carrier portion 112 of the second silicon substrate 106 remains attached to the silicon device film 110 through the separation layer 108 during the bonding operation.

Figure 1F:
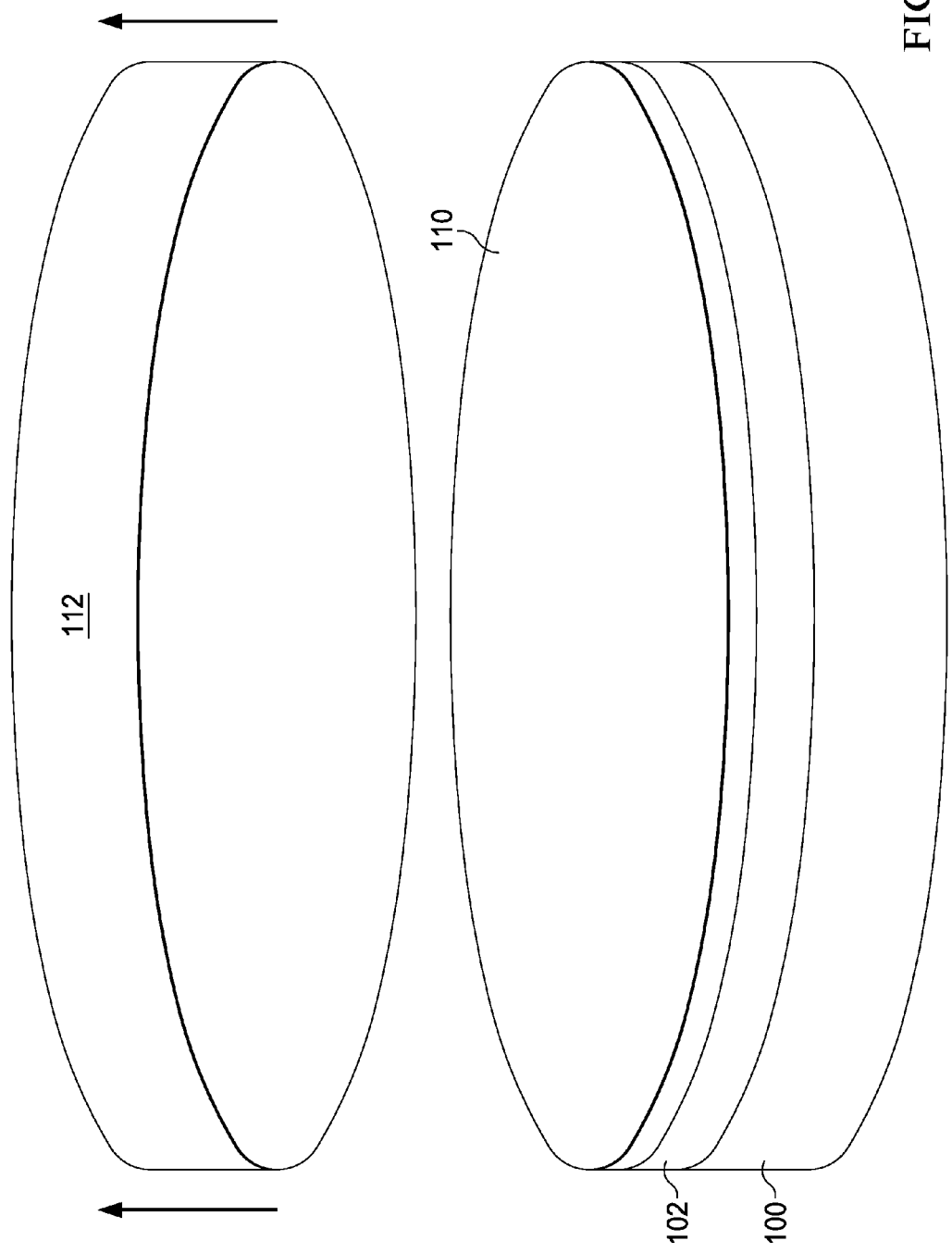

Referring to FIG. 1F, a separation process is performed which separates the carrier portion 112 from the silicon device film 110 at the separation layer 108, leaving the silicon device film 110 bonded to the layer stack of III-N semiconductor material 102. The separation process may include heating the carrier portion 112 above 450° C. Bonding between the silicon device film 110 and the layer stack of III-N semiconductor material 102 may become stronger during the separation process. The first substrate 100 remains attached to the layer stack of III-N semiconductor material 102.

Figure 1G:
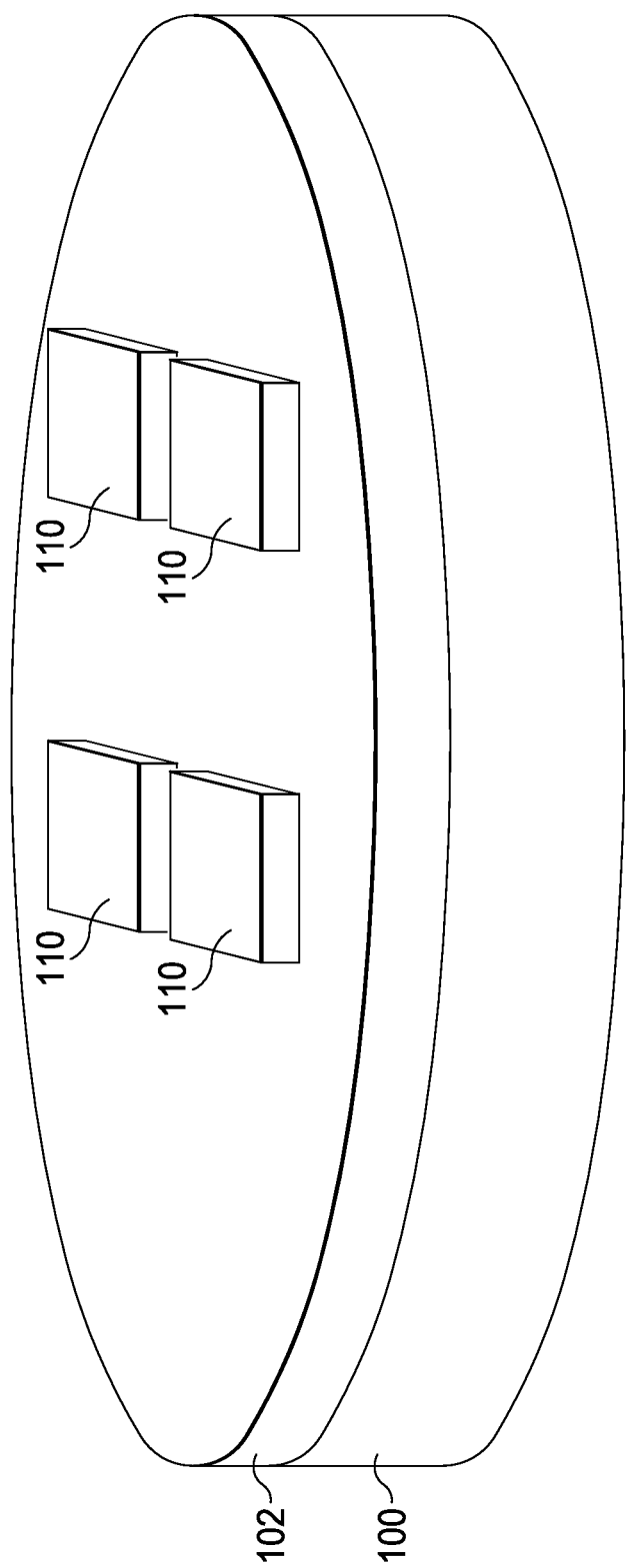

Referring to FIG. 1G, a portion of the silicon device film 110 is removed in areas for subsequent formation of components in the layer stack of III-N semiconductor material 102, leaving regions of the silicon device film 110 in place for subsequent formation of components in the silicon device film 110. The portion of the silicon device film 110 may be removed, for example, by forming an etch mask of photoresist which exposes the portion of the silicon device film 110 to be removed, and performing a silicon etch process to remove silicon in the exposed area. Other processes for removing the portion of the silicon device film 110 are within the scope of the instant example. In some versions of the instant embodiment, additional layers of III-N material may be formed on the layer stack of III-N semiconductor material 102 after the portion of the silicon device film 110 is removed.

Figure 1H:
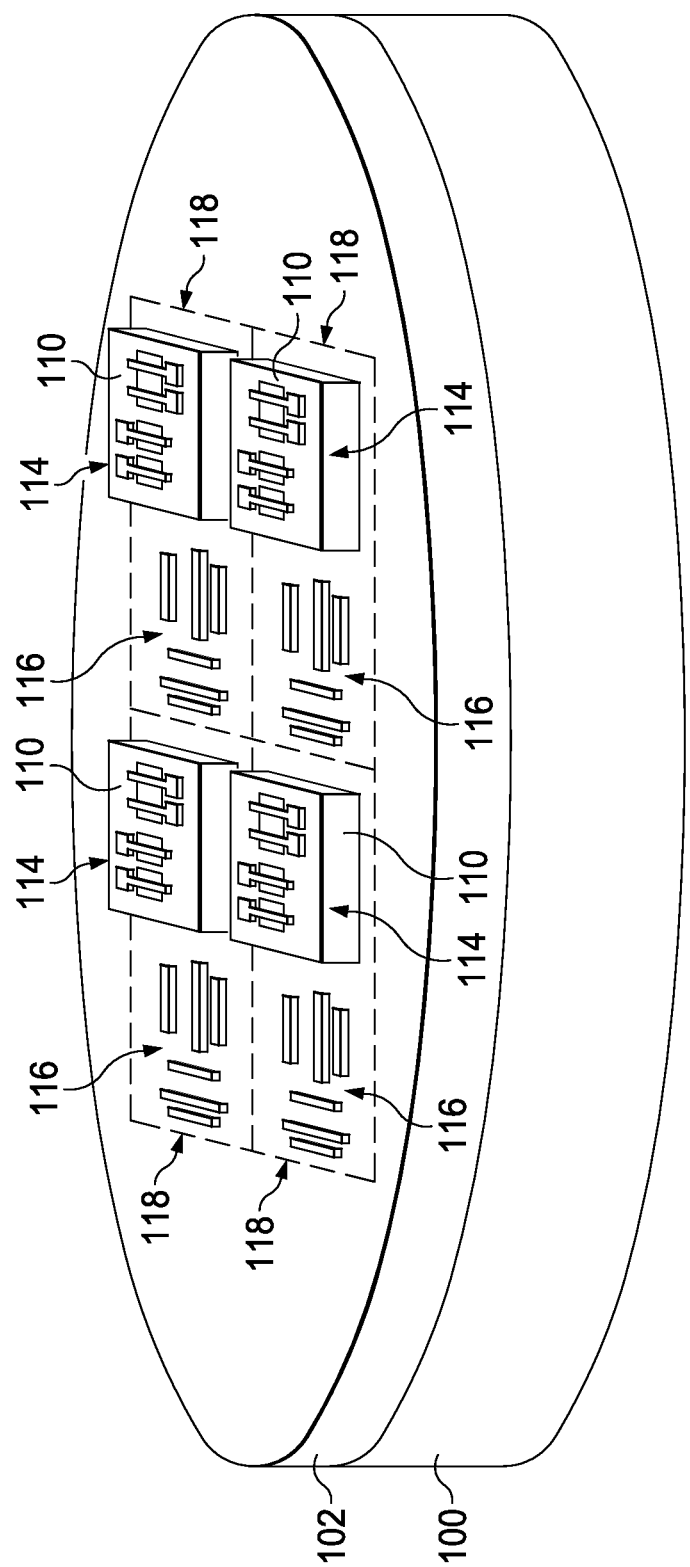

Referring to FIG. 1H, a first plurality of components 114 is formed in and/or on the silicon device film 110. The first plurality of components 114 may include, for example, MOS transistors as depicted in FIG. 1H. Other components, such as bipolar junction transistors, diodes and resistors, are within the scope of the instant example. A second plurality of components 116 is formed in and/or on the layer stack of III-N semiconductor material 102. The second plurality of components 116 may include, for example, GaN FETs as depicted in FIG. 1H. Other components, such as photodetectors, LEDs or lasers are within the scope of the instant example. Integrated silicon and III-N semiconductor devices 118 include instances of both the first plurality of components 114 in the silicon device film 110 and instances of the second plurality of components 116 in the layer stack of III-N semiconductor material 102. The integrated silicon and III-N semiconductor devices 118 are outlined in FIG. 1H with the phantom lines. The integrated silicon and III-N semiconductor devices 118 may be separated by scribing, sawing, or other segmentation processes. Forming the integrated silicon and III-N semiconductor devices 118 using the process described in reference to FIG. 1A through FIG. 1H may advantageously provide a lower fabrication cost and complexity than other processes in which the layer stack of III-N semiconductor material 102 is transferred to a different substrate than one on which the layer stack of III-N semiconductor material 102 was originally formed.

Figure 2A:
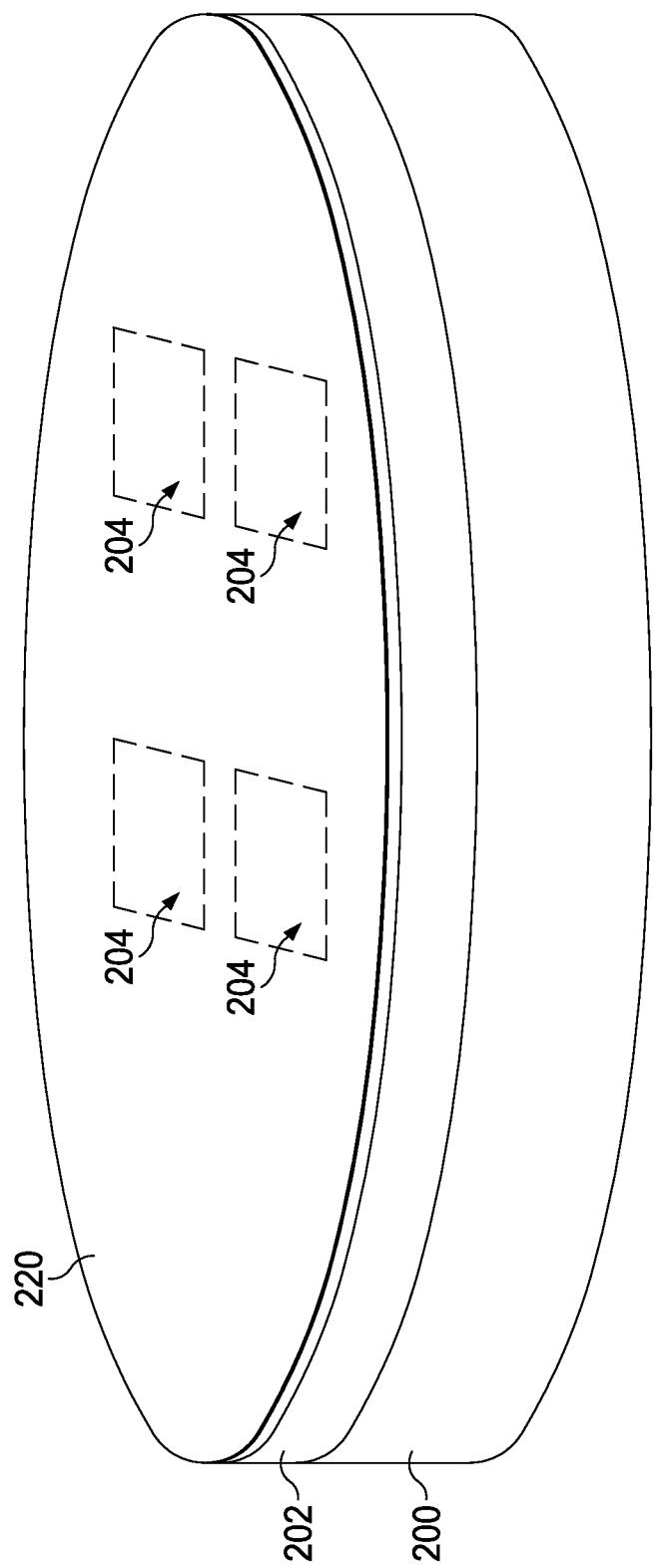
FIG. 2A through FIG. 2F depict formation of another integrated silicon and III-N semiconductor device in successive stages of fabrication.

FIG. 2A through FIG. 2F depict formation of another integrated silicon and III-N semiconductor device in successive stages of fabrication. Referring to FIG. 2A, a silicon single-crystal first substrate 200 is provided with a first crystal orientation, for example a 111 orientation. A layer stack of III-N semiconductor material 202 is formed on a top surface of the first substrate 200, as described in reference to FIG. 1A. Isolation regions 104 may be formed in areas defined for a subsequent silicon film, as described in reference to FIG. 1B and FIG. 1C. A first interlayer film 220 of dielectric material may be formed over the layer stack of III-N semiconductor material 202, and over the isolation regions 104 if present. The first interlayer film 220 may be, for example, 10 to 100 nanometers of silicon dioxide based dielectric material formed by spinning on methylsilsesquioxane (MSQ) and subsequently baking out solvents and annealing the dielectric material. Other dielectric materials and other formation processes for the first interlayer film 220 are within the scope of the instant example.

Figure 2B:
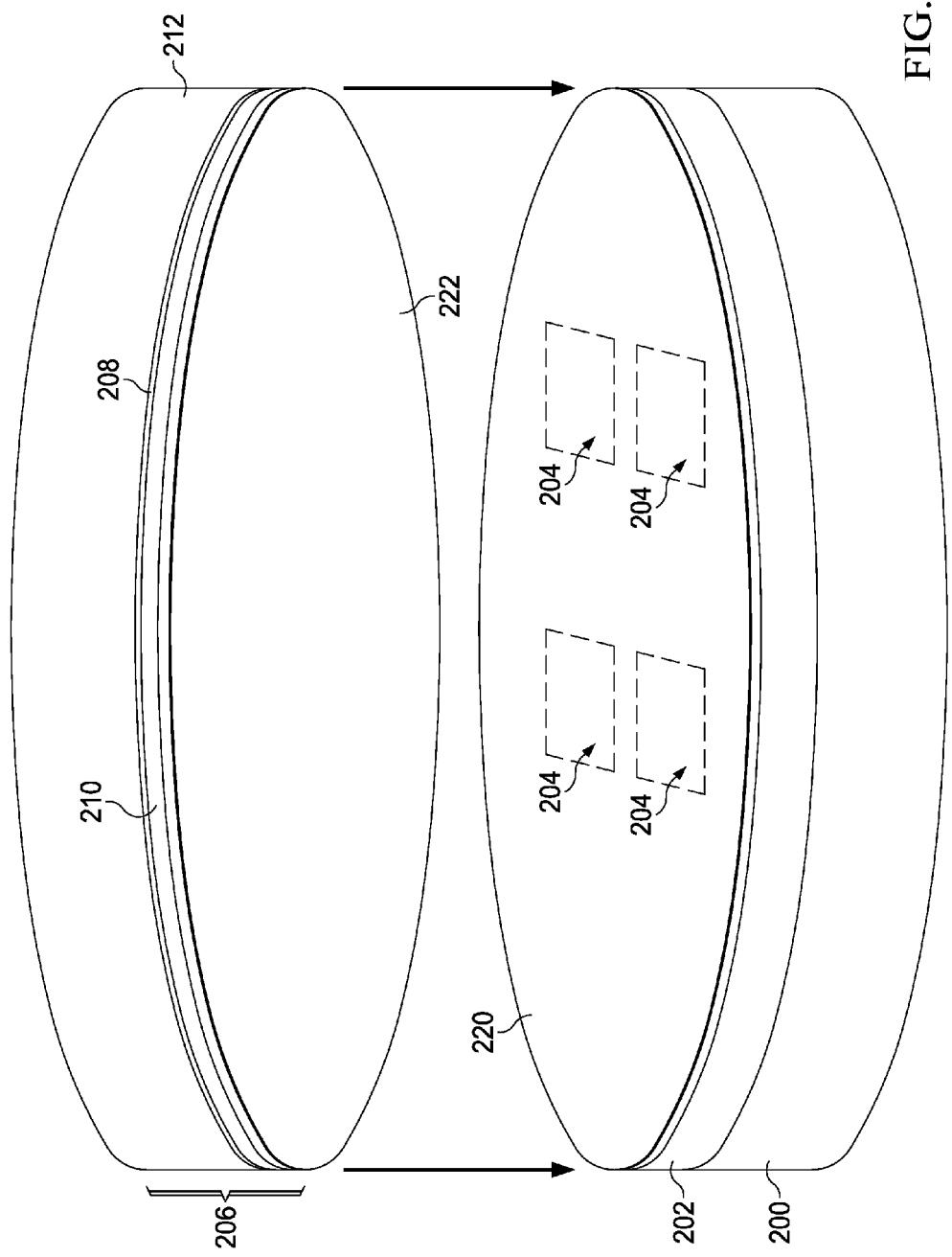

Referring to FIG. 2B, a second silicon substrate 206 is provided with a second crystal orientation, for example 100, different than the first orientation of the first substrate 200. A separation layer 208 is formed between a silicon device film 210 and a carrier portion 212 of the second silicon substrate 206, as described in reference to FIG. 1D. A second interlayer film 222 of dielectric material may be formed on the silicon device film 210. The second interlayer film 222 may be formed as described in reference to the first interlayer film 220. In the instant example, at least one of the first interlayer film 220 and the second interlayer film 222, and possibly both, is formed before proceeding to a subsequent bonding step.

Figure 2C:
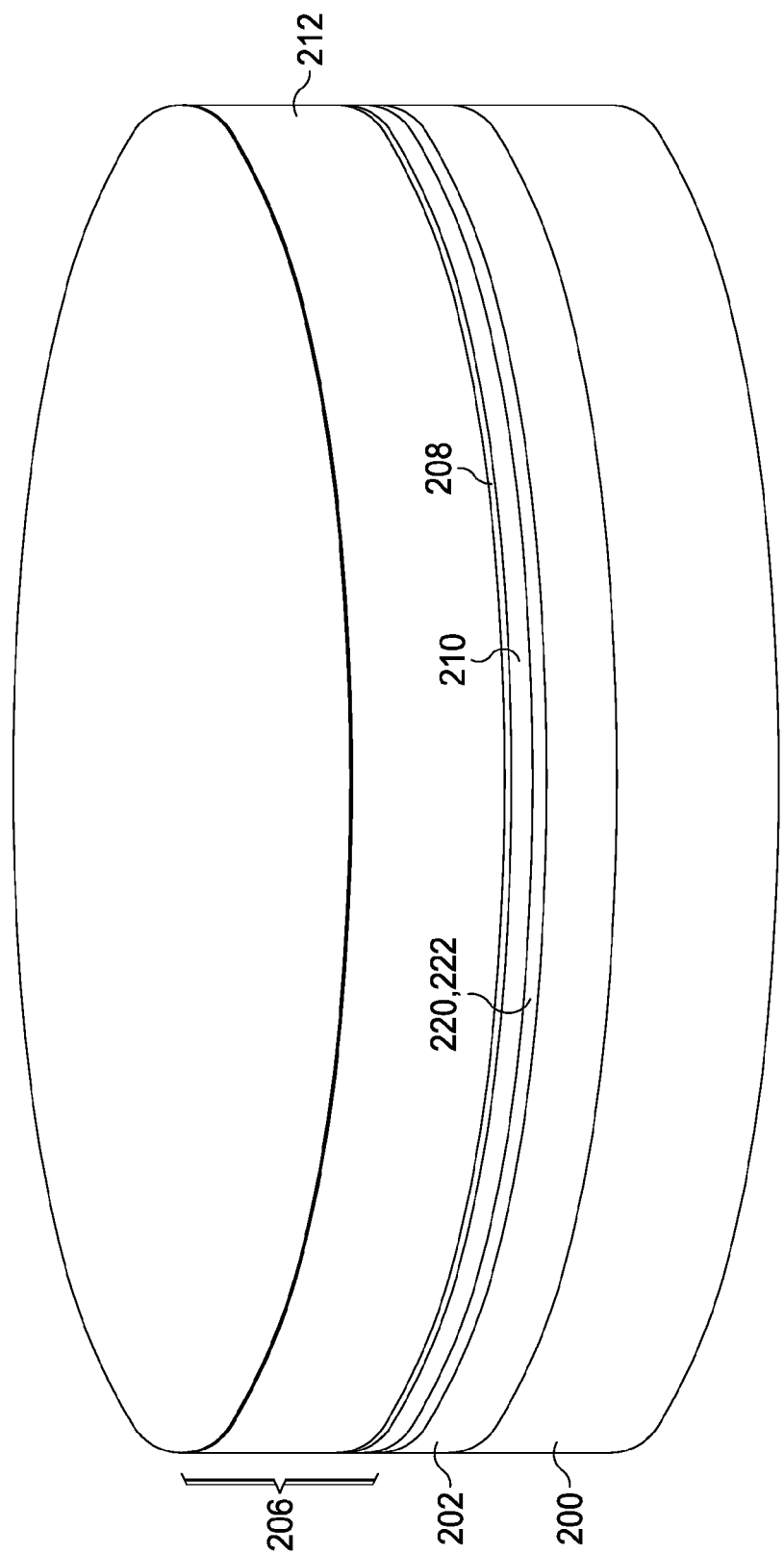

Referring to FIG. 2C, a bonding operation is performed in which the silicon device film 210 is at least partially bonded to the layer stack of III-N semiconductor material 202 through the first interlayer film 220 and/or the second interlayer film 222 present. The bonding operation may be similar to the bonding operation described in reference to FIG. 1E. The carrier portion 212 of the second silicon substrate 206 remains attached to the silicon device film 210 through the separation layer 208 during the bonding operation.

Figure 2D:
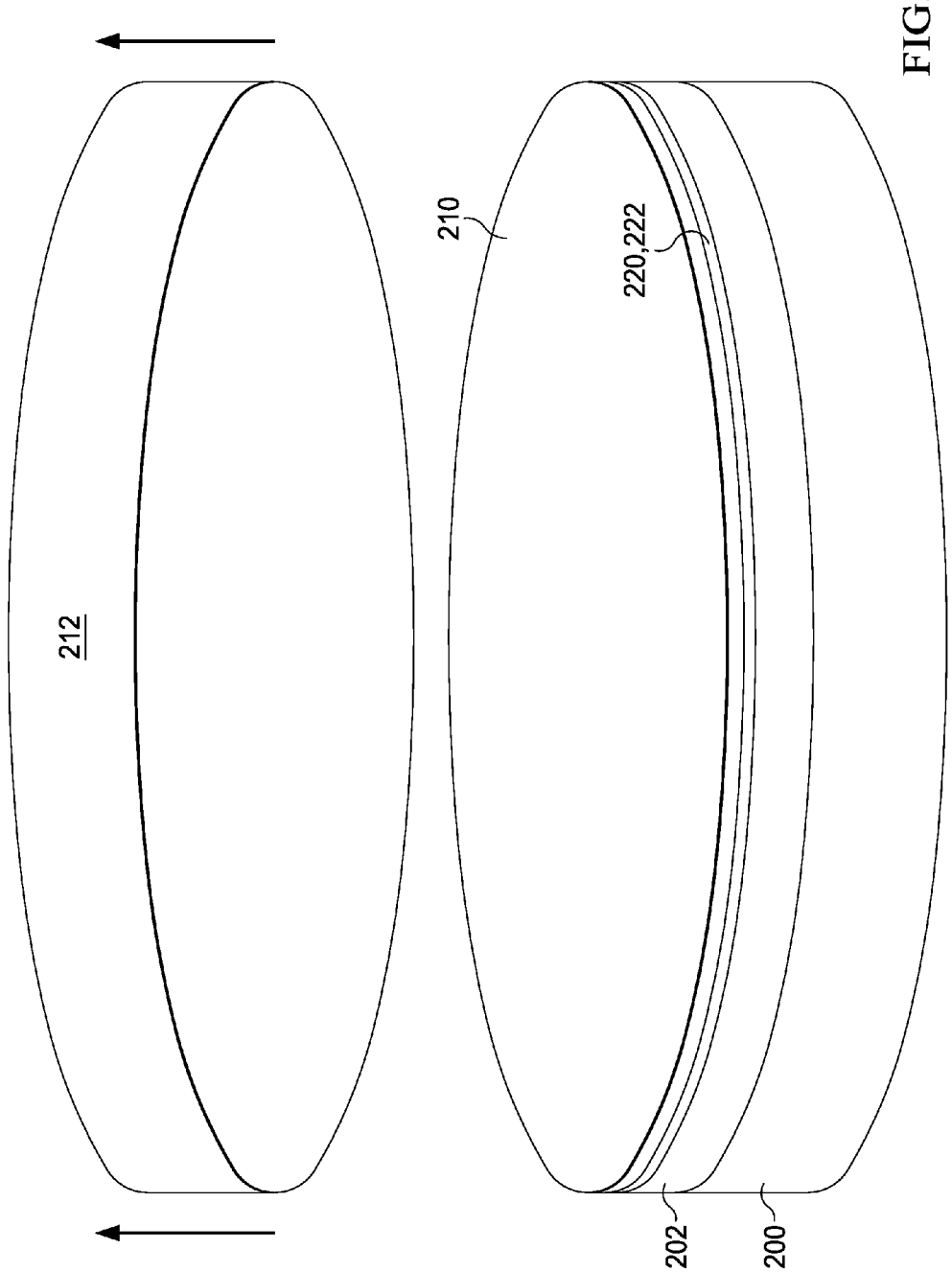

Referring to FIG. 2D, a separation process is performed which separates the carrier portion 212 from the silicon device film 210, leaving the silicon device film 210 bonded to the layer stack of III-N semiconductor material 202 through the first interlayer film 220 and/or the second interlayer film 222 present. The separation process may include heating the carrier portion 212 above 450° C. Bonding between the silicon device film 210, the first interlayer film 220 and/or the second interlayer film 222, and the layer stack of III-N semiconductor material 202 may become stronger during the separation process.

Figure 2E:
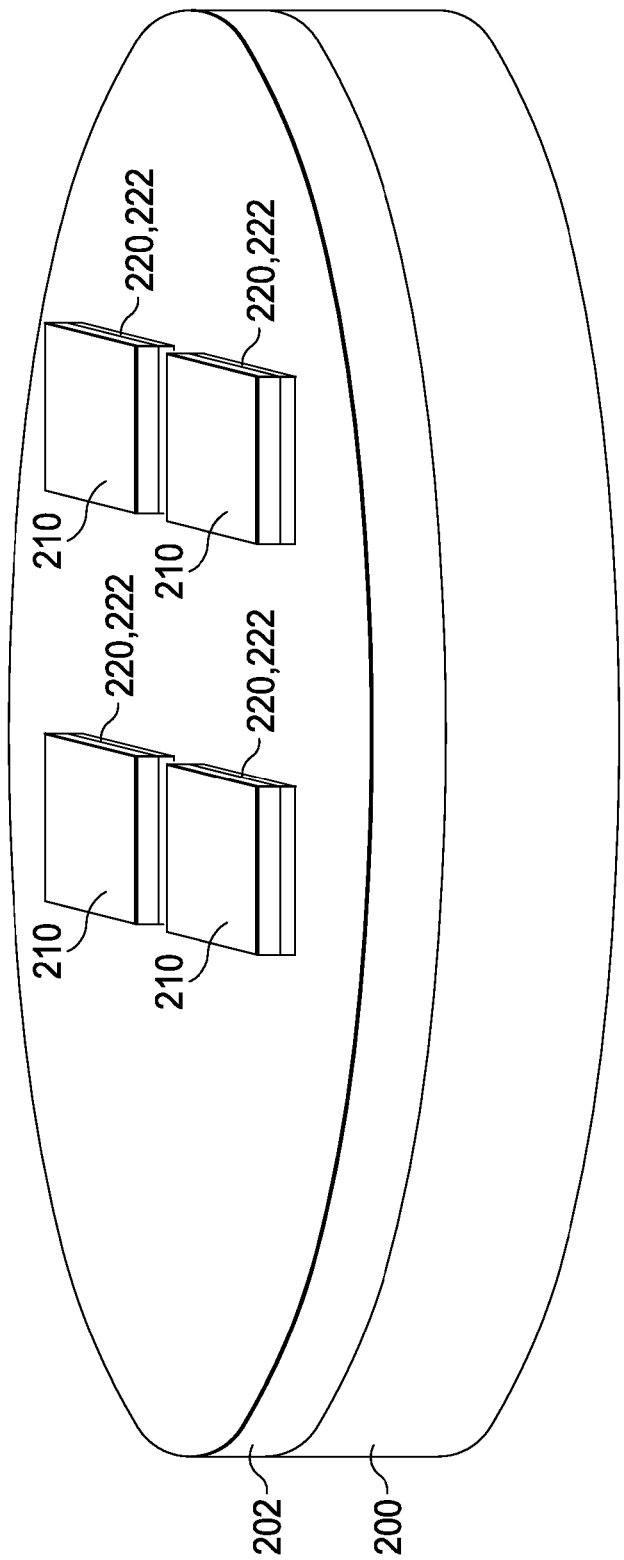

Referring to FIG. 2E, a portion of the silicon device film 210 and the underlying first interlayer film 220 and/or the second interlayer film 222 present is removed in areas for subsequent formation of components in the layer stack of III-N semiconductor material 202, leaving regions of the silicon device film 210 and the underlying first interlayer film 220 and/or the second interlayer film 222 in place for subsequent formation of components in the silicon device film 210. The portion of the silicon device film 210 and the underlying first interlayer film 220 and/or the second interlayer film 222 may be removed, for example, as described in reference to FIG. 1G. In some versions of the instant embodiment, additional layers of III-N material may be formed on the layer stack of III-N semiconductor material 202 after the portion of the silicon device film 210 and the underlying first interlayer film 220 and/or the second interlayer film 222 is removed.

Figure 2F:
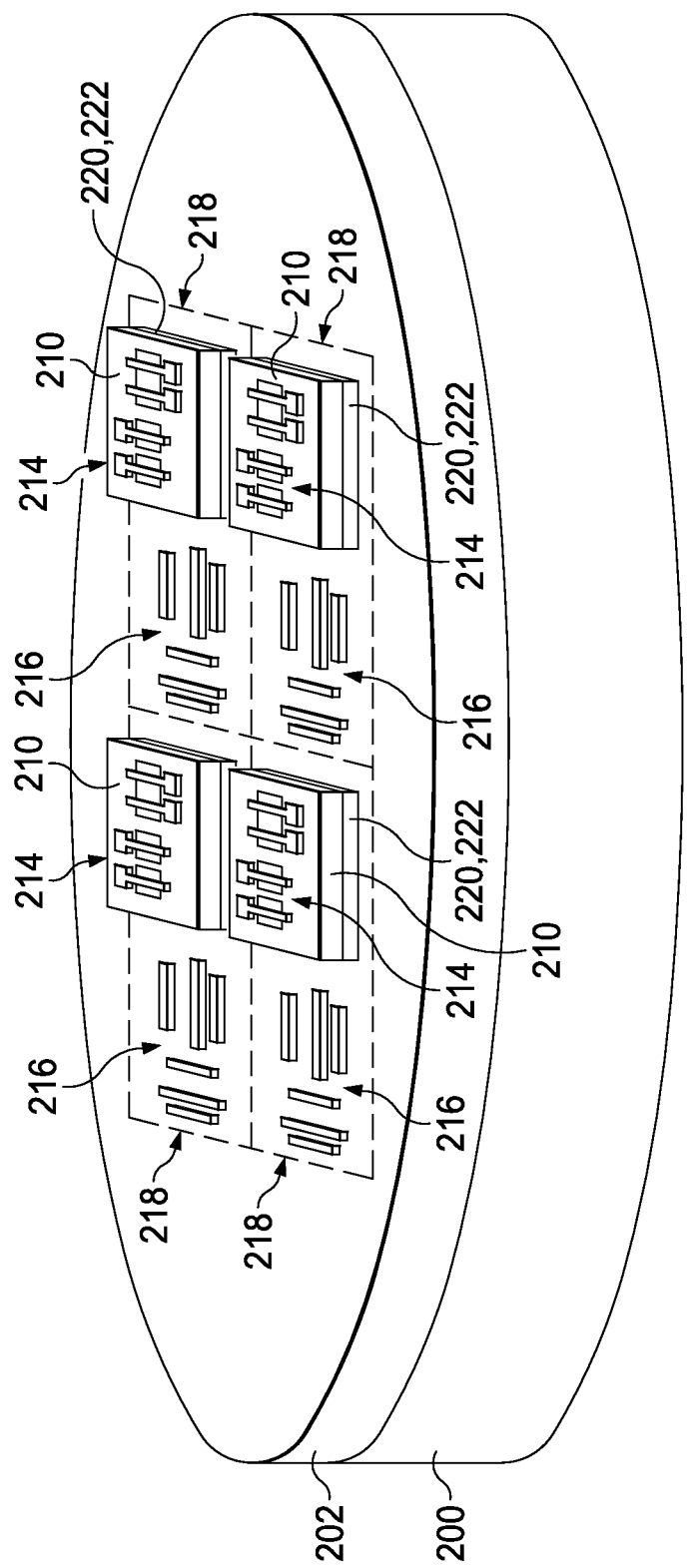

Referring to FIG. 2F, a first plurality of components 214 is formed in and/or on the silicon device film 210, and a second plurality of components 216 is formed in and/or on the layer stack of III-N semiconductor material 202, as described in reference to FIG. 1H. Integrated silicon and III-N semiconductor devices 218 include instances of both the first plurality of components 214 in the silicon device film 210 and instances of the second plurality of components 216 in the layer stack of III-N semiconductor material 202. The integrated silicon and III-N semiconductor devices 218 are outlined in FIG. 2F with the phantom lines. Forming the integrated silicon and III-N semiconductor devices 218 using the first interlayer film 220 and/or the second interlayer film 222 may provide a stronger structure including the silicon device film 210 and the layer stack of III-N semiconductor material 202 than a structure in which the silicon device film 210 is directly bonded to the layer stack of III-N semiconductor material 202.

Figure 3A:
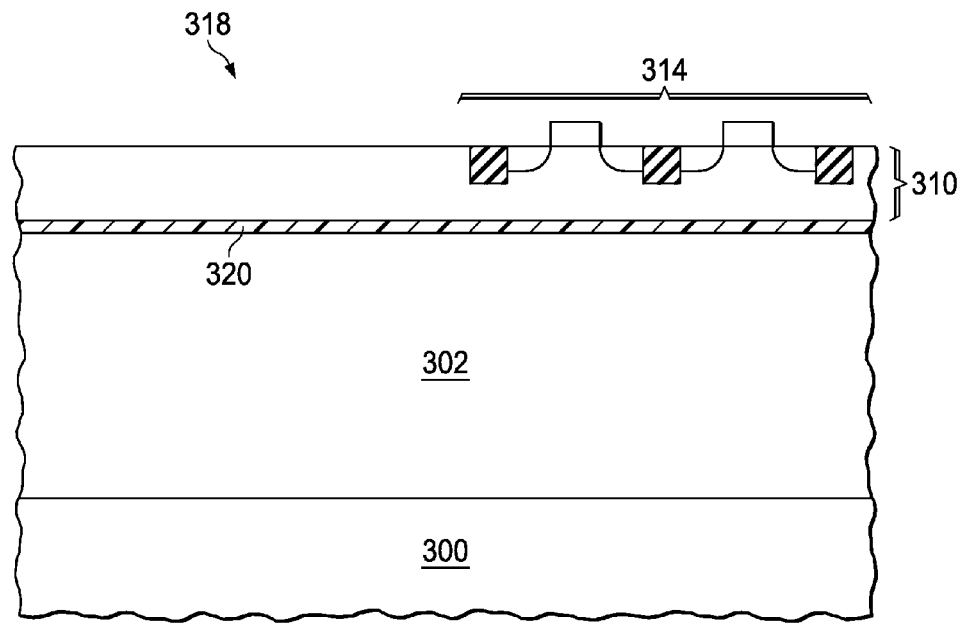
FIG. 3A through FIG. 3D are cross sections of a further integrated silicon and III-N semiconductor device in successive stages of fabrication.

FIG. 3A through FIG. 3D are cross sections of a further integrated silicon and III-N semiconductor device in successive stages of fabrication. Referring to FIG. 3A, the integrated silicon and III-N semiconductor device 318 is formed on a silicon first substrate 300 with a layer stack of III-N semiconductor material 302 formed on the first substrate 300. A silicon device film 310 is bonded to the layer stack of III-N semiconductor material 302, possibly through an optional interlayer film 320 of dielectric material. The silicon device film 310 has a different crystal orientation from the first substrate 300. A first plurality of components 314 is at least partially formed in and/or on the silicon device film 310. Isolation regions may be formed in the layer stack of III-N semiconductor material 302 under the first plurality of components 314.

Figure 3B:
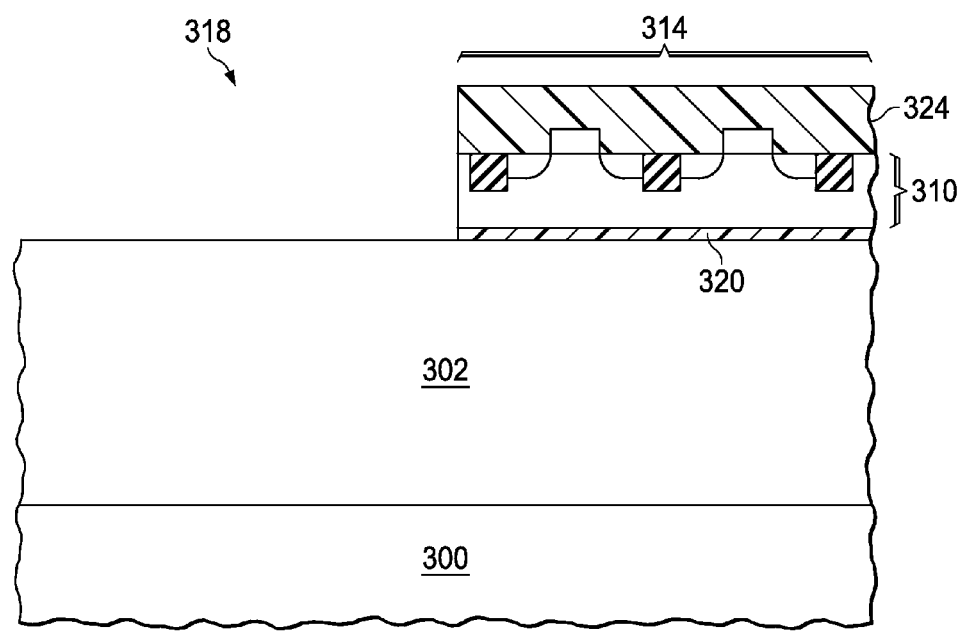

Referring to FIG. 3B, an etch mask 324 is formed over the first plurality of components 314. The etch mask 324 may include, for example, photoresist formed by a photolithographic process. A silicon film etch process is performed which removes silicon from the silicon device film 310 in areas exposed by the etch mask 324. The interlayer film 320, if present, is also removed in the areas exposed by the etch mask 324. The etch mask 324 may be removed after the silicon film etch process is completed.

Figure 3C:
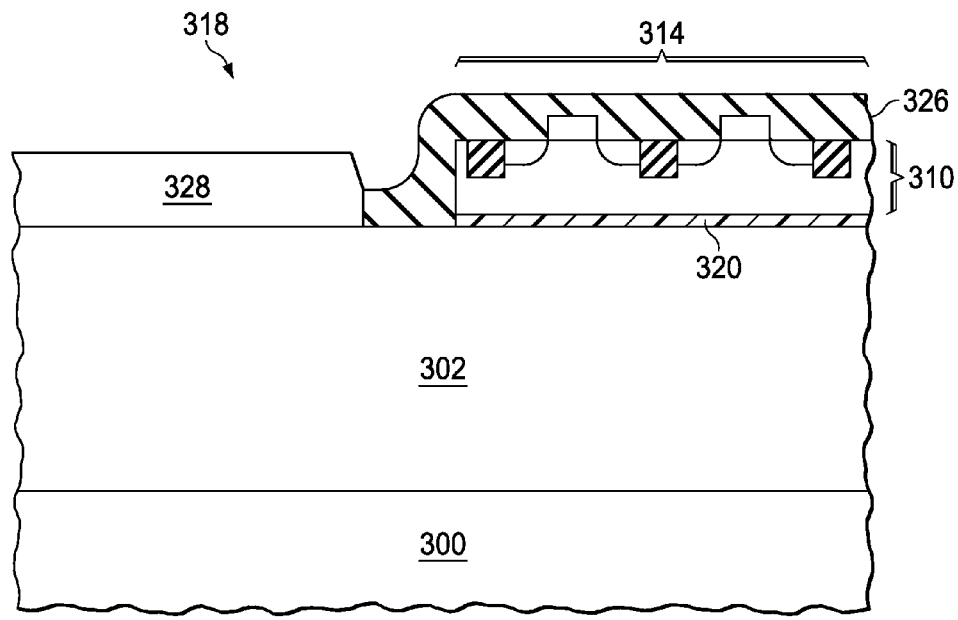

Referring to FIG. 3C, an epitaxial blocking layer 326 is formed over the first plurality of components 314 and exposes an area of the layer stack of III-N semiconductor material 302 for subsequent epitaxial growth of III-N semiconductor material. The epitaxial blocking layer 326 may include, for example, 100 to 300 nanometers of silicon dioxide formed by PECVD using TEOS.

Subsequently, additional III-N semiconductor material 328 is epitaxially grown on the exposed areas of the layer stack of III-N semiconductor material 302. The additional III-N semiconductor material 328 may include, for example, a barrier layer and gallium nitride cap. Formation of the barrier layer may generate a two-dimensional electron gas in an underlying gallium nitride layer. In such a case, formation of isolation regions in the under the layer stack of III-N semiconductor material 302 under the first plurality of components 314 may not be necessary.

Figure 3D:
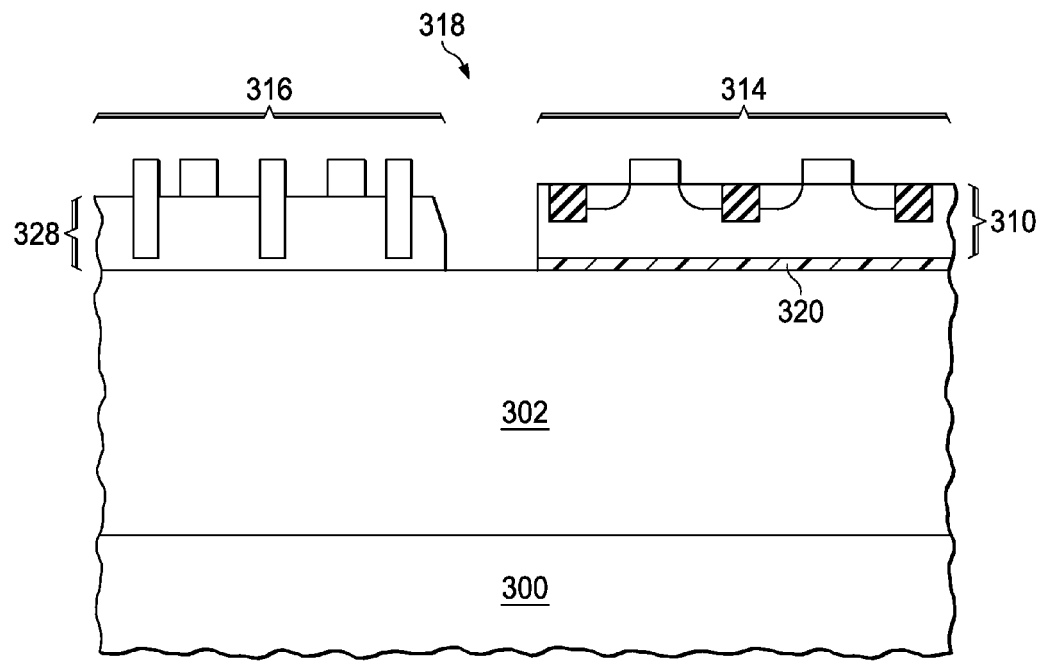

Referring to FIG. 3D, a second plurality of components 316 is formed in and/or on the additional III-N semiconductor material 328. The epitaxial blocking layer 326 is removed, possibly before the second plurality of components 316 is formed. Forming the additional III-N semiconductor material 328 after the silicon device film 310 is bonded to the layer stack of III-N semiconductor material 302 may advantageously provide higher performance in the second plurality of components 316, because the additional III-N semiconductor material 328 is not stressed by the bonding process.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated silicon and III-N semiconductor device, comprising the steps of:
   providing a first substrate of silicon having a first crystal orientation;
   forming a layer stack of III-N semiconductor material on a top surface of said first substrate;
   forming an isolation region on the first substrate in the layer stack of III-N semiconductor material;
   providing a second substrate of silicon having a second crystal orientation which is different from said first crystal orientation;
   implanting a cleaving species into said second substrate to form a separation layer in said second substrate which separates a silicon device film from a carrier portion of said second substrate;
   subsequently bonding said silicon device film to said layer stack of III-N semiconductor material, so that said carrier portion remains attached to said silicon device film through said separation layer;
   after bonding, heating the second substrate to separate said carrier portion from said silicon device film at said separation layer, so that said first substrate remains attached to said layer stack of III-N semiconductor material;
   removing a portion of said silicon device film so as to expose an area of said layer stack of III-N semiconductor material;
   forming a first plurality of components in and/or on said silicon device film over the isolation region in the layer stack of III-N semiconductor material; and
   forming a second plurality of components in and/or on said layer stack of III-N semiconductor material.

2. The method of claim 1, further comprising the step of forming an interlayer film of dielectric material on at least one said silicon device film and said layer stack of III-N semiconductor material, prior to said step of bonding.

3. The method of claim 2, in which said interlayer film is formed on said silicon device film prior to said step of bonding.

4. The method of claim 2, in which said interlayer film is formed on said layer stack of III-N semiconductor material prior to said step of bonding.

5. The method of claim 2, in which said interlayer film includes silicon dioxide based dielectric material.

6. The method of claim 1, in which said step of forming said isolation region includes ion implanting dopants into said layer stack of III-N semiconductor material in said isolation region.

7. The method of claim 1, in which said step of forming said isolation region includes removing III-N semiconductor material from said layer stack of III-N semiconductor material in said isolation region.

8. The method of claim 1, in which said first crystal orientation is (111).

9. The method of claim 1, in which said second crystal orientation is (100).

10. The method of claim 1, in which said first plurality of components includes a metal oxide semiconductor (MOS) transistor.

11. The method of claim 1, in which said second plurality of components includes a gallium nitride field effect transistor (GaN FET).

12. The method of claim 1 wherein the cleaving species is hydrogen.

13. A method of forming an integrated silicon and III-N semiconductor device, comprising the steps of:
   forming a stack of III-N semiconductor material layers on a first substrate of silicon having a first crystal orientation;
   forming an isolation region on the first substrate in the layer stack of III-N semiconductor material;
   providing a second substrate of silicon having a second crystal orientation which is different from said first crystal orientation;
   implanting hydrogen into said second substrate to form a separation layer in said second substrate which separates a silicon device film from a carrier portion of said second substrate;
   forming an interlayer film on at least one of the silicon device film or the stack of III-N semiconductor material layers;
   subsequently bonding said silicon device film to said stack of III-N semiconductor material layers at said interlayer film, so that said carrier portion remains attached to said silicon device film through said separation layer;
   after bonding, heating the second substrate to separate said carrier portion from said silicon device film at said separation layer, so that said first substrate remains attached to said stack of III-N semiconductor material layers;

removing a portion of said silicon device film so as to expose an area of said stack of III-N semiconductor material layers;

forming a first plurality of components in and/or on said silicon device film over the isolation region in the stack of III-N semiconductor material layers; and forming a second plurality of components in and/or on said layer stack of III-N semiconductor material.

* * * * *